United States Patent
Yang et al.

(10) Patent No.: US 9,627,050 B2
(45) Date of Patent: *Apr. 18, 2017

(54) MEMORY ACCESS MODULE FOR PERFORMING MEMORY ACCESS MANAGEMENT

(71) Applicant: Silicon Motion Inc., Hsinchu County (TW)

(72) Inventors: Tsung-Chieh Yang, Hsinchu (TW); Hsiao-Te Chang, Hsinchu County (TW); Wen-Long Wang, Hsinchu (TW)

(73) Assignee: Silicon Motion Inc., Hsinchu County (TW)

(*) Notice: Subject to any disclaimer, the term of this patent is extended or adjusted under 35 U.S.C. 154(b) by 0 days.

This patent is subject to a terminal disclaimer.

(21) Appl. No.: 15/213,419

(22) Filed: Jul. 19, 2016

(65) Prior Publication Data

US 2016/0329095 A1    Nov. 10, 2016

Related U.S. Application Data

(63) Continuation of application No. 14/956,410, filed on Dec. 2, 2015, which is a continuation of application
(Continued)

(51) Int. Cl.
*G11C 16/04* (2006.01)
*G11C 11/56* (2006.01)
(Continued)

(52) U.S. Cl.
CPC ........ *G11C 11/5642* (2013.01); *G06F 3/0622* (2013.01); *G06F 3/0638* (2013.01);
(Continued)

(58) Field of Classification Search
CPC .............. H03M 13/1111; H03M 13/45; G11C 11/5642; G11C 11/5628; G11C 16/26; G11C 13/0004; G11C 16/08
(Continued)

(56) References Cited

U.S. PATENT DOCUMENTS 7,746,602 B2    6/2010 Gill
7,746,692 B2    6/2010 Kohler
(Continued)

FOREIGN PATENT DOCUMENTS

TW    200836205    9/2008
TW    200905692    2/2009

OTHER PUBLICATIONS

Tsai, Title of Invention: Method for Performing Error Correction, Associated Memory Apparatus and Associated Controller Thereof, U.S. Appl. No. 14/455,953, filed Aug. 11, 2014.

*Primary Examiner* — David Lam
(74) *Attorney, Agent, or Firm* — Winston Hsu; Scott Margo

(57) ABSTRACT

A memory access module for performing memory access management of a storage device including a plurality of storage cells includes: sensing means for performing a plurality of sensing operations respectively corresponding to a plurality of different sensing voltages in order to generate at least a first digital value of a storage cell, wherein each subsequent sensing operation corresponds to a sensing voltage which is determined according to a result of the previous sensing operation; processing means for using the first digital value to obtain soft information of a bit stored in the storage cell; and decoding means for using the soft information to perform soft decoding.

10 Claims, 9 Drawing Sheets

Related U.S. Application Data

No. 14/327,580, filed on Jul. 10, 2014, now Pat. No. 9,239,685, which is a continuation of application No. 13/944,866, filed on Jul. 17, 2013, now Pat. No. 8,867,270, which is a continuation of application No. 13/089,330, filed on Apr. 19, 2011, now Pat. No. 8,508,991.

(60) Provisional application No. 61/325,811, filed on Apr. 19, 2010.

(51) Int. Cl.
*G11C 16/26* (2006.01)
*G06F 3/06* (2006.01)
*G11C 16/08* (2006.01)

(52) U.S. Cl.
CPC ........ *G06F 3/0679* (2013.01); *G11C 11/5628* (2013.01); *G11C 16/08* (2013.01); *G11C 16/26* (2013.01)

(58) Field of Classification Search
USPC ............ 365/185.03, 185.21, 185.28, 185.33, 365/185.11, 185.24
See application file for complete search history.

(56) References Cited

U.S. PATENT DOCUMENTS

| | | | |
|---|---|---|---|
| 7,903,467 B2 | 3/2011 | Lee | |
| 8,059,457 B2 * | 11/2011 | Perlmutter | G11C 8/08 365/185.03 |
| 8,504,884 B2 | 8/2013 | Eguchi | |
| 8,508,991 B2 | 8/2013 | Yang | |
| 8,656,257 B1 | 2/2014 | Micheloni | |
| 8,867,270 B2 | 10/2014 | Yang | |
| 9,239,685 B2 | 1/2016 | Yang | |
| 2010/0199149 A1 | 8/2010 | Weingarten | |
| 2012/0198314 A1 | 8/2012 | Yang | |
| 2013/0117640 A1 | 5/2013 | Tai | |
| 2013/0215678 A1 | 8/2013 | Yang | |
| 2013/0275829 A1 | 10/2013 | Sridhara | |

\* cited by examiner

MEMORY ACCESS MODULE FOR PERFORMING MEMORY ACCESS MANAGEMENT

CROSS REFERENCE TO RELATED APPLICATIONS

The present application is a continuation application of U.S. application Ser. No. 14/956,410, filed on Dec. 2, 2015, which is a continuation application of U.S. Pat. No. 9,239,685, filed on Jul. 10, 2014, which is a continuation application of U.S. Pat. No. 8,867,270, filed on Jul. 17, 2013, which is a continuation application of U.S. Pat. No. 8,508,991, filed on Apr. 19, 2011, which claims priority of U.S. Provisional Application No. 61/325,811, filed on Apr. 19, 2010. All contents are included herein by reference.

BACKGROUND OF THE INVENTION

1. Field of the Invention

The present invention relates to access to a Flash memory, and more particularly, to a method for performing memory access management, and to an associated memory device and a controller thereof.

2. Description of the Prior Art

As technologies of memories progress in recent years, many kinds of portable memory devices, such as memory cards respectively complying with SD/MMC, CF, MS, and XD standards, are widely implemented in various applications. Therefore, the control of access to memories in these portable memory devices has become an important issue.

Taking NAND Flash memories as an example, they can mainly be divided into two types, i.e. Single Level Cell (SLC) Flash memories and Multiple Level Cell (MLC) Flash memories. Each transistor that is considered a memory cell in SLC Flash memories only has two charge levels that respectively represent a logical value 0 and a logical value 1. In addition, the storage capability of each transistor that is considered a memory cell in MLC Flash memories can be fully utilized. More specifically, the voltage for driving memory cells in the MLC Flash memories is typically higher than that in the SLC Flash memories, and different voltage levels can be applied to the memory cells in the MLC Flash memories in order to record information of at least two bits (e.g. binary values 00, 01, 11, or 10) in a transistor that is considered a memory cell. Theoretically, the storage density of the MLC Flash memories may reach twice the storage density of the SLC Flash memories, which is considered good news for NAND Flash memory manufacturers who encountered a bottleneck of NAND Flash technologies.

As MLC Flash memories are cheaper than SLC Flash memories, and are capable of providing higher capacity than SLC Flash memories while the space is limited, MLC Flash memories have been a main stream for implementation of most portable memory devices on the market. However, various problems of the MLC Flash memories have arisen due to their unstable characteristics. In order to ensure that the access control of a portable memory device over the Flash memory therein can comply with related standards, the controller of the Flash memory should have some handling mechanisms in order to properly handle its data access operations.

According to the related art, the portable memory device having the aforementioned handling mechanisms may still suffer from some deficiencies. For example, the error rate of the MLC Flash memories may incredibly increase in some situations, and the traditional error correction mechanism is far from enough to handle the burst errors in these situations. Hence, an improved memory access mechanism including both of the error correction mechanism and data access mechanism is required.

SUMMARY OF THE INVENTION

It is therefore an objective of the claimed invention to provide a memory access module for performing memory access management in order to solve the above-mentioned problems.

According to a preferred embodiment of the claimed invention, a memory access module for performing memory access management of a storage device comprising a plurality of storage cells comprises: sensing means for performing a plurality of sensing operations respectively corresponding to a plurality of different sensing voltages in order to generate at least a first digital value of a storage cell, wherein each subsequent sensing operation corresponds to a sensing voltage which is determined according to a result of the previous sensing operation; processing means for using the first digital value to obtain soft information of a bit stored in the storage cell; and decoding means for using the soft information to perform soft decoding.

The plurality of sensing operations further generates a second digital value of a storage cell, wherein the second digital value comprises a plurality of second digital values, and each of the second digital values is generated according to another of the second digital values. The second digital values are also used to obtain the soft information of a same bit stored in the storage cell. When a result of a first sensing operation is that current flows through the storage cell, a subsequent sensing operation will correspond to a sensing voltage which is less than a sensing voltage corresponding to the first sensing operation, and when a result of a first sensing operation is that current does not flow through the storage cell, a subsequent sensing operation will correspond to a sensing voltage which is higher than a sensing voltage corresponding to the first sensing operation.

The memory access module further comprises controlling means for accessing the storage device, wherein the controlling means comprises: storage means for storing a program code; and processing means for executing a program code to control access to the storage device and manage the plurality of storage cells.

These and other objectives of the present invention will no doubt become obvious to those of ordinary skill in the art after reading the following detailed description of the preferred embodiment that is illustrated in the various figures and drawings.

DETAILED DESCRIPTION

I. Memory System

Figure 1A:
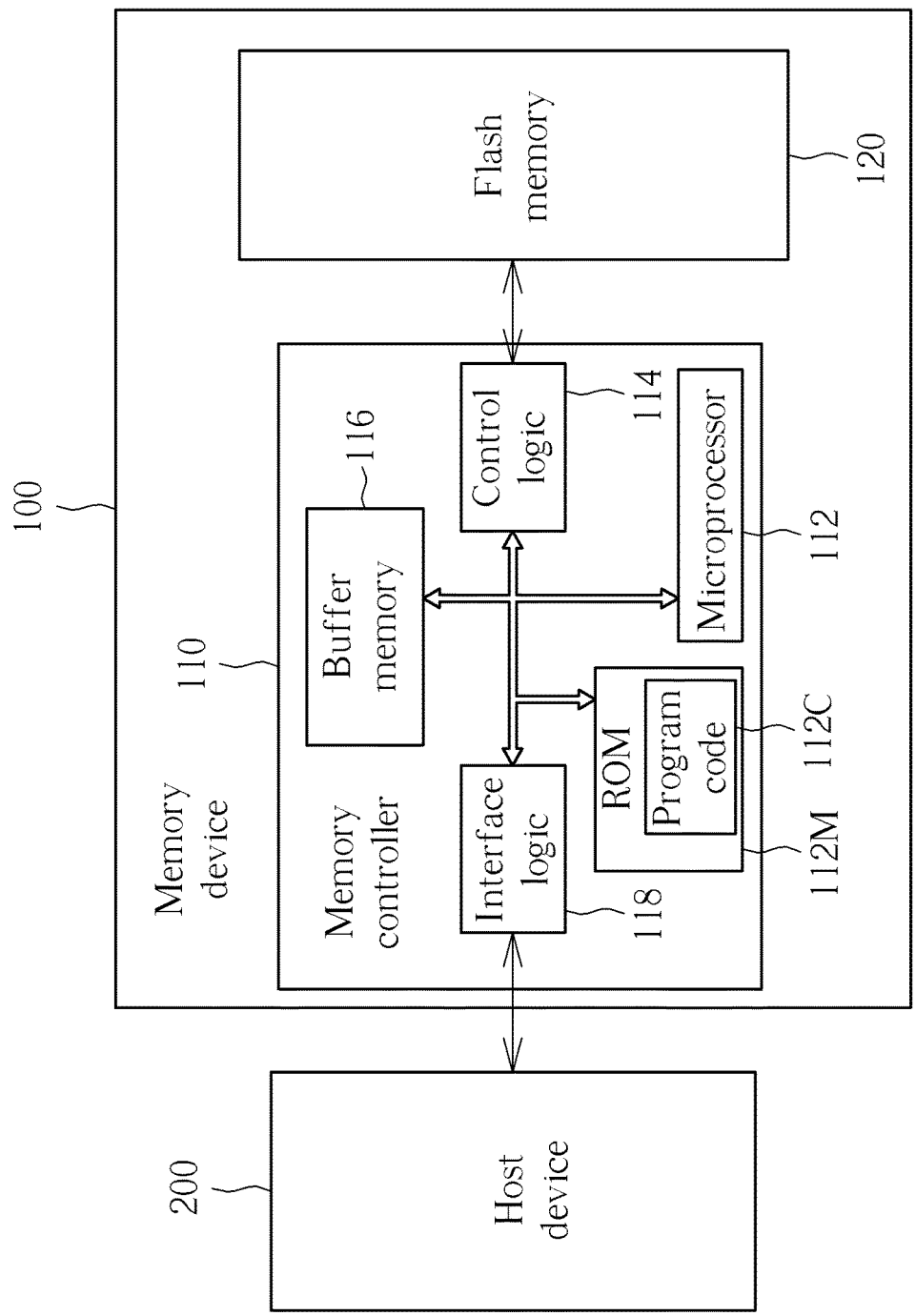
FIG. 1A is a diagram of a memory device and a host device according to a first embodiment of the present invention.

Please refer to FIG. 1A, which illustrates a diagram of a memory device 100 and a host device 200 according to a first embodiment of the present invention. In particular, the memory device 100 of this embodiment is a portable memory device, examples of which may include, but not limited to, memory cards complying with SD/MMC, CF, MS, or XD standards, and Universal Serial Bus (USB) Flash drives (which can be referred to as USB Flash disks). The memory device 100 comprises a controller and a memory, where the controller is arranged to access the memory. For example, the controller and the memory can be a memory controller 110 and a Flash memory 120, respectively, and the memory controller 110 is arranged to access the Flash memory 120. According to this embodiment, the memory controller 110 comprises a microprocessor 112, a storage such as a read only memory (ROM) 112M, a control logic 114, a buffer memory 116, and an interface logic 118. In addition, the ROM 112M of this embodiment is arranged to store a program code 112C, and the microprocessor 112 is arranged to execute the program code 112C to control the access to the Flash memory 120. In some embodiments, such as some variations of the first embodiment, the program code 112C can be stored in the buffer memory 116 or any other memory. Please note that the portable memory device is taken as an example of the memory device 100 in this embodiment. This is for illustrative purposes only, and is not meant to be a limitation of the present invention. According to a variation of this embodiment, the memory device 100 can be a solid state drive (SSD).

In this embodiment, the host device 200 can access the memory device 100 by sending commands and corresponding logical addresses to the memory controller 110. The memory controller 110 receives the commands and the logical addresses, and controls the Flash memory 120 to read, write/program, or erase some memory units in the Flash memory 120, and more particularly, the memory units having physical addresses corresponding to the logical address.

Figure 1B:
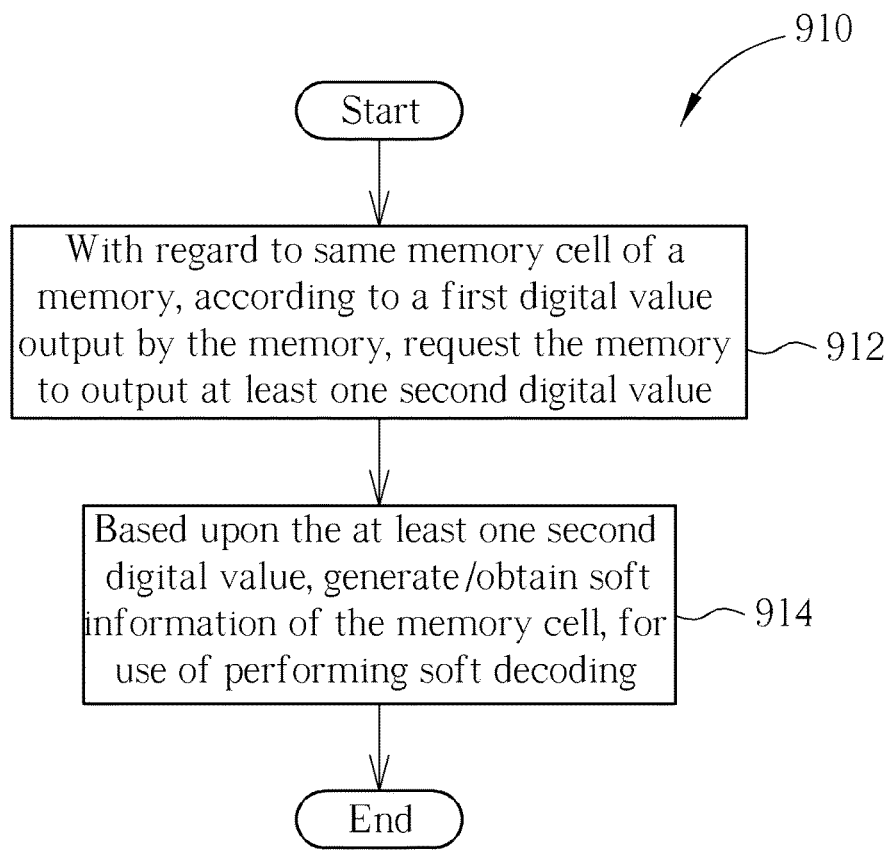
FIG. 1B is a flowchart of a method for performing memory access management according to an embodiment of the present invention.

FIG. 1B is a flowchart of a method 910 for performing memory access management according to an embodiment of the present invention, where the method 910 can be applied to the memory device 100 shown in FIG. 1A, and more particularly, to some component (s) therein, such as the Flash memory 120 and/or the memory controller 110 that executes the program code 112C by utilizing the microprocessor 112. In Step 912, with regard to the same memory cell of a memory such as the Flash memory 120, according to a first digital value output by the memory, the memory device 100 (and more particularly, the memory controller 110 that executes the program code 112C by utilizing the microprocessor 112) requests the memory to output at least one second digital value, where the first digital value and the aforementioned at least one second digital value are utilized for determining information of the same bit stored in the memory cell, and the number of various possible states (i.e. various possible storage states) of the memory cell is equal to the number of various possible combinations of all bit(s) stored in the memory cell. For example, the aforementioned all bit (s) may comprise a single bit, and the number of various possible combinations thereof can be regarded as 2 since the value of the single bit can be 0 or 1. In another example, the aforementioned all bit(s) may comprise X bit(s), and the number of various possible combinations thereof can be regarded as $2^x$ since the value of each bit of the X bit(s) can be 0 or 1. In Step 912, based upon the aforementioned at least one second digital value, the memory device 100 (and more particularly, the memory controller 110 that executes the program code 112C by utilizing the microprocessor 112) generates/obtains soft information of the memory cell, for use of performing soft decoding. More particularly, the soft information is determined according to charge distribution statistics information of the aforementioned memory such as the Flash memory 120. Related details of the architecture shown in FIG. 1A and the method shown in FIG. 1B are further described as follows.

II. Hard Decoding and Soft Decoding

The aforementioned memory comprises a plurality of memory units. In different embodiments of the present invention, the memory mentioned above can be any types of memories. Here, the Flash memory 120 is taken as an example of the memory. The Flash memory 120 may comprise a plurality of Flash chips, and each Flash chip may comprise a plurality of blocks, where each block is an erase unit for the memory controller 110. A block may comprise a plurality of pages, where each page is a write/program unit for the memory controller 110. A page may comprise a plurality of sectors, where each sector is a read unit for the memory controller 110. Physically, the block comprises a plurality of Flash cells arranged in an array, and each Flash cell is a floating gate transistor, and a string of Flash cells may store at least one page of data. Please note that, in general, the invention scope is not limited in the Flash memory. In this situation, the Flash cells mentioned above can generally be referred to as memory cells, such as the memory cell mentioned in Step 912.

Figure 2:
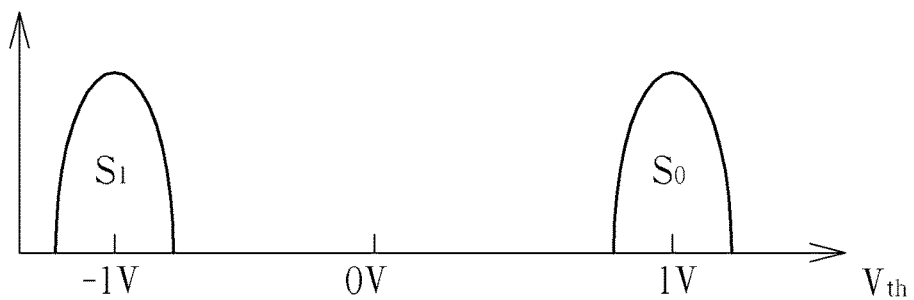
FIG. 2 illustrates the threshold voltage distribution of Flash cells of Single Level Cell (SLC) Flash memories and corresponding states according to an embodiment of the present invention.

As illustrated above, each transistor that is considered a memory cell in Single Level Cell (SLC) Flash memories only has two charge levels that respectively represent a logical value 0 and a logical value 1. The characteristic of each memory cell, however, is slightly different from that of another memory cell. Thus, two memory cells programmed with the same logic value (e.g. the same logic value "1" for both of the two memory cells) may have different charge levels (and even in such a situation, the two memory cells can still be regarded as memory cells of the same state). In other words, the two memory cells may have different threshold voltages, where each threshold voltage is utilized for representing a threshold value upon which it can be determined whether a voltage applied to the memory cell under consideration is high enough to make this memory cell turn on, and the threshold voltage and the charge level of the memory cell correspond to each other. FIG. 2 illustrates the threshold voltage distribution of the Flash cells of SLC Flash memories and the corresponding states $S_1$ and $S_0$ according to an embodiment of the present invention, where the state $S_1$ represents a state of writing/programming with the logic value "1", and the state $S_0$ represents a state of writing/programming with the logic value "0". In FIG. 2, the horizontal axis (or the x axis, in some aspects of the present invention) represents the threshold voltage of a Flash cell and is labeled "$V_{th}$", and the vertical axis (or the y axis, in some aspects of the present invention) represents the probability that a Flash cell has a certain threshold voltage. For example, a Flash cell programmed with the logic value "1" will have the highest probability to have the threshold voltage of −1 Volt (V). In another example, a Flash cell programmed with the logic value "0" will have the highest probability to have the threshold voltage of 1 V.

Typically, in a situation where the Flash memory 120 is implemented with SLC Flash memory chip(s), the memory controller 110 controls the Flash memory 120 to program one bit of information in a Flash cell and to read one bit of information from the Flash cell, where the aforementioned one bit of information that is read from the Flash cell can be regarded as an example of the first digital value mentioned in Step 912. In addition, a string of Flash cells can be arranged to be a page, and the memory controller 110 may program a page of data into a string of Flash cells at one time. The page of data programmed into the Flash cells comprises the host data sent from the host device 200, the control information required for accessing data, and error correction code generated by the memory controller 110 according to the host data in the same page. While reading, the Flash memory 120 determines the threshold voltages of the respective Flash cells corresponding to the read page (or the request page, i.e. the page to be read under the request of the memory controller 110), and replies the memory controller 110 with the corresponding logical values, where the corresponding logical values that the Flash memory 120 determines according to the threshold voltages of the respective Flash cells are the data of the read page, which can be referred to as the read page data for simplicity. The memory controller 110 decodes the read page data with particular error correction mechanism, and replies the host device 200 with correct data. The decoding mechanism operated in this way can be deemed as the hard decoding mechanism, and the read page data determined by the Flash memory 120 can be deemed as "hard information". The hard decoding mechanism, however, is not enough for handling burst errors in the new generation Flash memories, such as Multiple Level Cell (MLC) Flash memories or Triple Level Cell (TLC) Flash memories, where TLC Flash memories can be regarded as a type of MLC Flash memories, in general. More information, especially the threshold voltage of each Flash cell or the related information thereof, is required in error correction mechanism for providing better error correction capability.

Once the Flash memory 120 can provide the memory controller 110 with "soft information" of the respective Flash cells in the Flash memory 120, and more particularly, the soft information corresponding to the threshold voltage (or the charge level) of the memory cell under consideration, the memory controller 110 can utilize the soft information to perform soft decoding, such as Low-Density Parity-check Code (LDPC) decoding. Thus, better error correction capability can be achieved. For example, in a situation where the Flash memory 120 is implemented with SLC Flash memory chip(s), the memory controller 110 controls the Flash memory 120 to program one bit of information in a Flash cell, to read a plurality of digital values such as N bits of information from the Flash cell (where N>1), and to reply the memory controller 110 with the N bits of information.

More particularly, the plurality of digital values may comprise the aforementioned first digital value and the aforementioned at least one second digital value, and therefore, the N bits of information may comprise the hard information and the soft information of the Flash cell.

Please note that, according to some embodiments of the present invention, at least one portion (e.g. a portion or all) of the digital values may represent the threshold voltage (or the charge level) of the memory cell under consideration, or represent the related information of the threshold voltage (or the charge level). For example, the aforementioned at least one second digital value may represent at least one candidate threshold voltage (or at least one candidate charge level) of the memory cell, or represent the representative information thereof, where the memory controller 110 can determine the threshold voltage (or the charge level) of the memory cell according to the aforementioned at least one candidate threshold voltage (or the aforementioned at least one candidate charge level). In another example, the aforementioned at least one second digital value may represent whether at least one candidate threshold voltage (or at least one candidate charge level) of the memory cell is high or low, where the memory controller 110 can determine the threshold voltage (or the charge level) of the memory cell according to whether the aforementioned at least one candidate threshold voltage (or the aforementioned at least one candidate charge level) is high or low. According to some special cases of these embodiments, the aforementioned at least one second digital value may comprise a plurality of second digital values, where according to one of the second digital values, the memory controller 110 can request the Flash memory 120 to output another of the second digital values.

Figure 3:
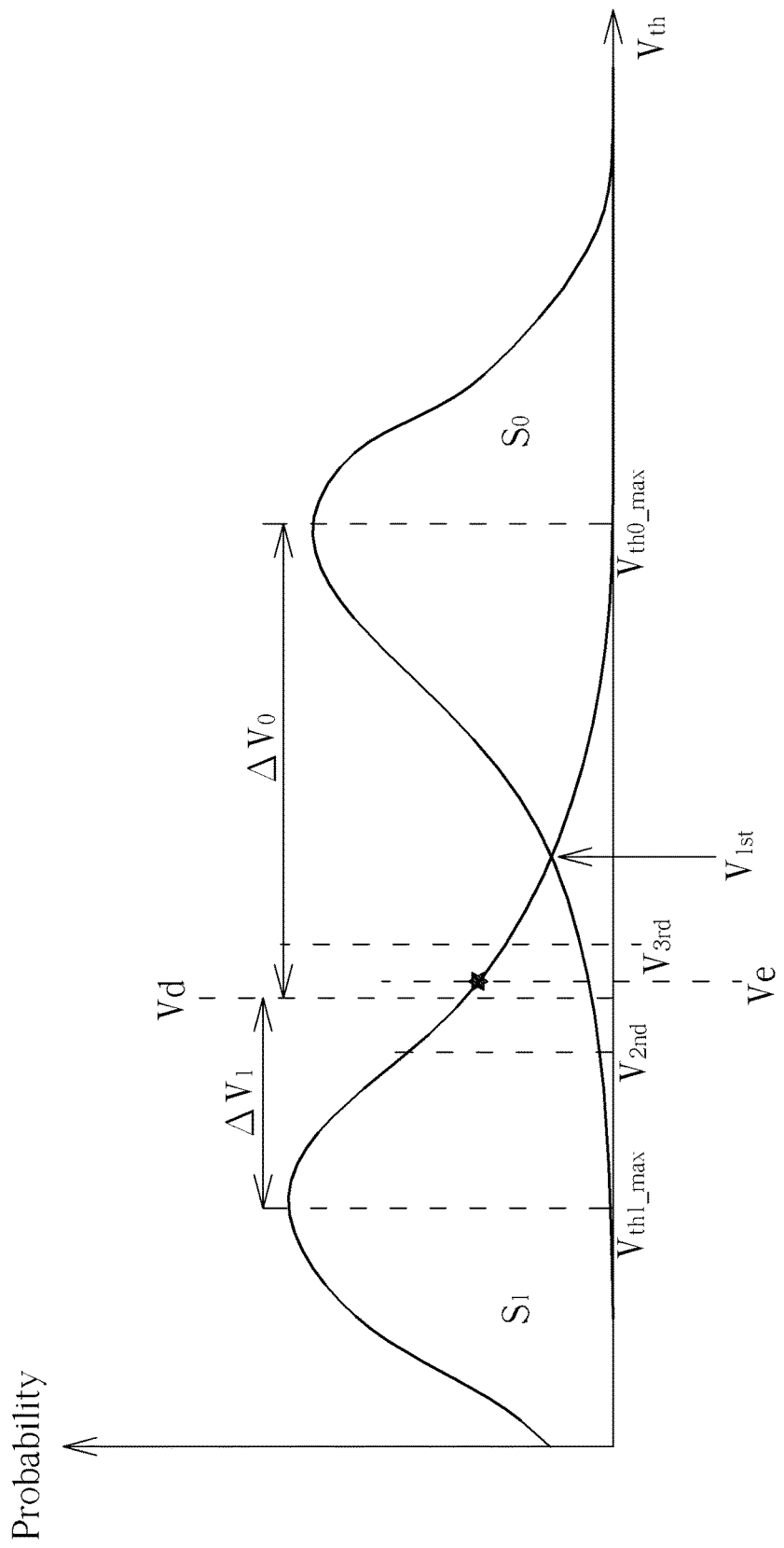
FIG. 3 illustrates the threshold voltage distribution of Flash cells of SLC Flash memories and corresponding states and associated sensing voltages according to an embodiment of the present invention.

In addition, according to some embodiments of the present invention, the Flash memory 120 can generate the soft information for being utilized by the memory controller 110. This is for illustrative purposes only, and is not meant to be a limitation of the present invention. In some variations of these embodiments, according to the soft information generated by the Flash memory 120, the memory controller 110 can further generate related soft information. Referring to FIG. 3, related details for obtaining the soft information are further described as follows.

III. Obtaining Soft Information

FIG. 3 illustrates the threshold voltage distribution of the Flash cells of SLC Flash memories and the corresponding states $S_1$ and $S_0$ and the associated sensing voltages according to an embodiment of the present invention. According to this embodiment, the memory controller 110 can control the Flash memory 120 to perform sensing operations by respectively utilizing a plurality of sensing voltages that are not all the same, in order to generate at least one portion of digital values within the first digital value and the aforementioned at least one second digital value, such as a portion or all of the elements of the set formed with both the first digital value and the aforementioned at least one second digital value. In practice, the aforementioned sensing voltages that are not all the same can be different sensing voltages, in order to achieve the best performance. For example, the memory controller 110 can control the Flash memory 120 to perform sensing operations by respectively utilizing different sensing voltages, in order to generate the first digital value and the aforementioned at least one second digital value. More particularly, in a situation where the aforementioned at least one second digital value comprises the plurality of second digital values, the memory controller 110 controls the Flash memory 120 to perform sensing operations by respectively utilizing different sensing voltages, in order to generate the second digital values. In another example, in a situation where the aforementioned at least one second digital value comprises the plurality of second digital values, the memory controller 110 controls the Flash memory 120 to perform sensing operations by respectively utilizing different sensing voltages, in order to generate at least one portion of digital values within the first digital value and the second digital values, such as a portion or all of the elements of the set formed with both the first digital value and the second digital values.

As shown in FIG. 3, a Flash cell programmed with the logic value "0" will have the highest probability to have the threshold voltage of $V_{th0\_max}$, and a Flash cell programmed with the logic value "1" will have the highest probability to have the threshold voltage of $V_{th1\_max}$. Here, the memory cell under consideration can be referred to as the under estimation memory cell. In FIG. 3, the notation "Ve" represents the exact threshold voltage (or charge level) of the under estimation memory cell, where the star pattern is utilized for illustrating the horizontal location of the exact threshold voltage Ve in FIG. 3, for better comprehension. In order to find the exact threshold voltage Ve, the Flash memory 120 is arranged to apply the first sensing voltage $V_{1st}$ to the gate of the under estimation memory cell and to detect whether any current flows through the under estimation memory cell. For example, the first sensing voltage $V_{1st}$ may correspond to the intersection point of the threshold voltage distribution curve of the logic value "1" (i.e. the threshold voltage distribution curve in a situation where the respective memory cells are programmed with the logic value "1") and the threshold voltage distribution curve of the logic value "0" (i.e. the threshold voltage distribution curve in a situation where the respective memory cells are programmed with the logic value "0"). In another example, the first sensing voltage $V_{1st}$ can be located at the center of the threshold voltages $V_{th1\_max}$ and $V_{th0\_max}$ along the horizontal axis (i.e. the average of the threshold voltages $V_{th1\_max}$ and $V_{th0\_max}$), or can be another value such as a predetermined value. In the situation shown in FIG. 3, as the first sensing voltage $V_{1st}$ is greater than the exact threshold voltage Ve, it is detected by the Flash memory 120 that a current flows through the under estimation memory cell.

Next, the Flash memory 120 is arranged to reduce the sensing voltage, and more particularly, to apply the second sensing voltage $V_{2nd}$ to the gate of the under estimation memory cell and to detect whether any current flows through the under estimation memory cell. For example, the second sensing voltage $V_{2nd}$ can be located at the center of the threshold voltage $V_{th1\_max}$ and the first sensing voltage $V_{1st}$ along the horizontal axis (i.e. the average of the threshold voltage $V_{th1\_max}$ and the first sensing voltage $V_{1st}$). In the situation shown in FIG. 3, as the second sensing voltage $V_{2nd}$ is less than the exact threshold voltage Ve, it is detected by the Flash memory 120 that no current flows through the under estimation memory cell.

Afterward, the Flash memory 120 is arranged to increase the sensing voltage, and more particularly, to apply the third sensing voltage $V_{3rd}$ to the gate of the under estimation memory cell and to detect whether any current flows through the under estimation memory cell. For example, the third sensing voltage $V_{3rd}$ can be located at the center of the first sensing voltage $V_{1st}$ and the second sensing voltage $V_{2nd}$ along the horizontal axis (i.e. the average of the first sensing voltage $V_{1st}$ and the second sensing voltage $V_{2nd}$). In the situation shown in FIG. 3, as the third sensing voltage $V_{3rd}$ is greater than the exact threshold voltage Ve, it is detected by the Flash memory 120 that a current flows through the under estimation memory cell.

In practice, the number of sensing operations performed by utilizing sensing voltages (e.g. the sensing operations disclosed in the embodiment shown in FIG. 3) can be determined as required. According to some embodiments of the present invention, with regard to the under estimation memory cell, the memory device 100 (and more particularly, the components therein, such as the Flash memory 120 or the memory controller 110 that executes the program code 112C by utilizing the microprocessor 112) can determine a determined threshold voltage Vd (which can be referred to as the determined voltage Vd hereafter, for simplicity). For example, if three times of sensing operations are sufficient for clearly describing the threshold voltage (or charge level) of the under estimation memory cell (e.g. it is clear enough to describe the threshold voltage of the under estimation memory cell by utilizing the information obtained from performing the three times of sensing operations), the determined voltage Vd of the under estimation memory cell can be calculated as follows:

$$Vd=((V_{2nd}+V_{3rd})/2).$$

Similarly, if (K+1) times of sensing operations are sufficient for clearly describing the threshold voltage (or charge level) of the under estimation memory cell (e.g. K>0) (e.g. it is clear enough to describe the threshold voltage of the under estimation memory cell by utilizing the information obtained from performing the (K+1) times of sensing operations), the determined voltage Vd of the under estimation memory cell can be calculated as follows:

$$Vd=((V_K+V_{K+1})/2);$$

where the notation "$V_K$" represents the sensing voltage of the $K^{th}$ sensing operation (or the $K^{th}$ sensing voltage, for simplicity), and the notation "$V_{K+1}$" represents the sensing voltage of the $(K+1)^{th}$ sensing operation (or the $(K+1)^{th}$ sensing voltage, for simplicity).

In addition, according to some embodiments of the present invention, when the determined voltage Vd is determined, the memory device 100 (and more particularly, the components therein, such as the Flash memory 120 or the memory controller 110 that executes the program code 112C by utilizing the microprocessor 112) can determine related soft information SI of the under estimation memory cell according to the determined voltage Vd. For example, in a situation where the determined voltage Vd is determined by the memory controller 110, the memory controller 110 further determines the soft information SI according to the determined voltage Vd. In another example, in a situation where the determined voltage Vd is determined by the Flash memory 120, the Flash memory 120 further determines the soft information SI according to the determined voltage Vd. In another example, in a situation where the determined voltage Vd is determined by the Flash memory 120, the memory controller 110 determines the soft information SI according to the determined voltage Vd.

According to an embodiment of the present invention, assume that the voltage difference between the determined voltage Vd and the threshold voltage $V_{th0\_max}$ is $\Delta V_0$, and the voltage difference between the determined voltage Vd and the threshold voltage $V_{th1\_max}$ is $\Delta V_1$. The memory device 100 (and more particularly, the memory controller 110) can determine the soft information SI according to the determined voltage Vd and according to the voltage differences $\Delta V_0$ and $\Delta V_1$, and more particularly, can determine the soft information SI according to the following equation:

$$SI=\log(e^{(-1/k)*(\Delta V_1)^2}/e^{(-1/k)*(\Delta V_0)^2}) \quad (1).$$

For example, if $\Delta V_1 = 0.5$ and $\Delta V_0 = 1.5$, the soft information SI is equal to 2. The soft information SI is a positive value, which indicates that the information stored in the memory cell (i.e. the aforementioned under estimation memory cell in this embodiment) can roughly be determined to be "1" and the reliability of the determination is 2. In another example, if $\Delta V_1 = 0.1$ and $\Delta V_0 = 1.9$, the soft information SI is equal to 3.6. The soft information SI is a positive value, which indicates that the information stored in the memory cell can roughly be determined to be "1" and the reliability of the determination is 3.6. In another example, if $\Delta V_1 = 1.1$ and $\Delta V_0 = 0.9$, the soft information SI is equal to −0.4. The soft information SI is a negative value, which indicates that the information stored in the memory cell can roughly be determined to be "0" and the reliability of the determination is 0.4. Here, the reliability of the soft information SI can be expressed by utilizing the second digital values mentioned above. Please note that the method for determination of the soft information SI by the memory device 100 is not limited to that disclosed by Equation (1). According to some variations of this embodiment, when the probability distribution represented by the threshold voltage distribution curve is asymmetric or irregular, a weighting value can be introduced to the calculations regarding the soft information SI that are performed by the memory device 100 (and more particularly, the components therein, such as the Flash memory 120 or the memory controller 110 that executes the program code 112C by utilizing the microprocessor 112). For example, variance or other parameter(s) can be utilized for performing normalization during the calculations. According to some variations of this embodiment, based upon the number of times of programming operations or the number of times of erasure operations, the memory device 100 (and more particularly, the components therein, such as the Flash memory 120 or the memory controller 110 that executes the program code 112C by utilizing the microprocessor 112) can update the representative information of the probability distribution mentioned above, such as the threshold voltage distribution curve or the curve parameter(s)/data thereof.

According to an embodiment of the present invention, in a situation where the soft information SI is determined by the Flash memory 120, the Flash memory 120 can convert the soft information SI into a digital form, and more particularly, can generate the digital soft information $SI_d$ according to the soft information SI, and send the digital soft information $SI_d$ to the memory controller 110 or reply the memory controller 110 with the digital soft information $SI_d$. For example, with regard to the memory cell under consideration, the digital soft information $SI_d$ can be a digital value of one byte or a digital value of multiple bytes. In general, with regard to the memory cell, the digital soft information $SI_d$ can be a digital value of N' bits. In practice, the most significant bit (MSB) of the digital soft information $SI_d$ can be a sign bit, which can roughly represent the information stored in the memory cell (or the storage information). More particularly, the sign bit can be regarded as the hard information mentioned above, where the combination of the hard information and the soft information can generally be regarded as soft information since such a combination can be utilized for soft decoding. In most cases, the memory controller 110 determines the information stored in the memory cell by reading the sign bit only. While a read error occurs, the memory controller 110 reads other bits of the digital soft information $SI_d$, for curing the read error.

IV. Transmitting Soft Information to Memory Controller

Figure 4:
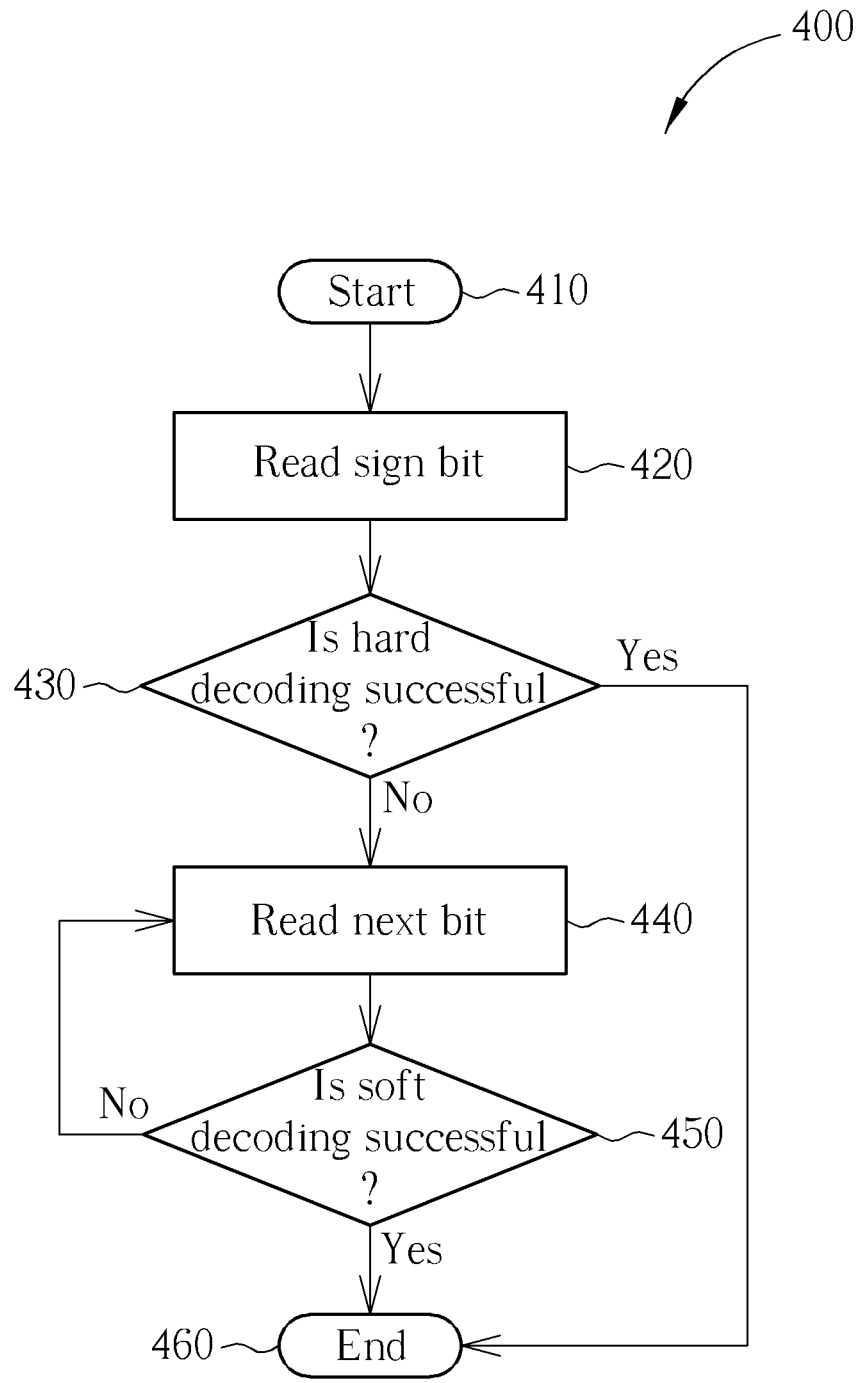
FIG. 4 is a flowchart of a method 400 for reading a page of data according to an embodiment of the present invention.

FIG. 4 is a flowchart of a method 400 for reading a page of data according to an embodiment of the present invention, where this embodiment is a variation of the embodiment shown in FIG. 1B. Step 410 is the beginning of the method 400, and represents the beginning of reading a page of data in the aforementioned memory such as the Flash memory 120. In Step 420, with regard to the respective memory cells corresponding to the same page within the Flash memory 120, the memory controller 110 controls the Flash memory 120 to read the respective sign bits thereof, i.e. the sign bits of the memory cells, such as the sign bits of the soft information of the memory cells, respectively. As a result, the Flash memory 120 replies the memory controller 110 with these sign bits, and the memory controller 110 performs hard decoding on these sign bits to verify the correctness. For example, the hard decoding can be BCH (Bose, Ray-Chaudhuri, Hocquenghem) decoding. In Step 430, when it is detected that the hard decoding is successful, which means it is detected that the decoding result is error-free or correctable, Step 460 is entered to end the working flow shown in FIG. 4; otherwise (i.e. the failure of the hard decoding is detected), Step 440 is entered. In Step 440, with regard to each memory cell of at least one portion of the memory cells (e.g. a memory cell of the memory cells, or a portion or all of the memory cells), the memory controller 110 controls the Flash memory 120 to read the next bit, i.e. the $n^{th}$ bit starting from the sign bit within the soft information of the memory cell under consideration, for performing soft decoding by utilizing the memory controller 110, where n represents the total number of times that Step 440 has been executed after Step 420 and Step 430 are executed and Step 440 is entered plus one. More particularly, the aforementioned at least one portion of the memory cells comprises all of the memory cells. As a result, the Flash memory 120 replies the memory controller 110 with the $n^{th}$ bit of each of the memory cells, and the memory controller 110 performs soft decoding on the bits to verify the correctness of the data. For example, the soft decoding can be the LDPC decode mentioned above. In Step 450, when it is detected that the soft decoding is successful, which means the decoding result is error-free or correctable, Step 460 is entered to end the working flow shown in FIG. 4; otherwise (i.e. the failure of the soft decoding is detected), Step 440 is re-entered. As soft decoding is executed only when needed, and as the number of times of performing soft decoding is increased only when needed, extremely high performance can be achieved according to the present invention without increasing the need of the bandwidth between the memory controller 110 and the Flash memory 120.

Please note that, under control of the memory controller 110, the above illustrated sensing operations that are performed by utilizing the sensing voltages, the operations of determining the soft information (e.g. the $n^{th}$ bit mentioned above), and the operations of replying with the soft information can be performed by the Flash memory 120. More particularly, when the memory controller 110 controls the Flash memory 120 to read (or reply with) the next bit(s), the Flash memory 120 only performs required sensing operations (e.g. by utilizing the sensing voltage $V_K$ such as any of the sensing voltages $V_{1st}$, $V_{2nd}$, and $V_{3rd}$) and required soft information determination to the extent that meets the resolution requirement of the memory controller 110. Therefore, while achieving extremely high performance, the present invention will not cause any unnecessary working load of the memory controller 110 and the Flash memory 120.

V. Soft Information Determination in TLC Flash Memory

Figure 5:
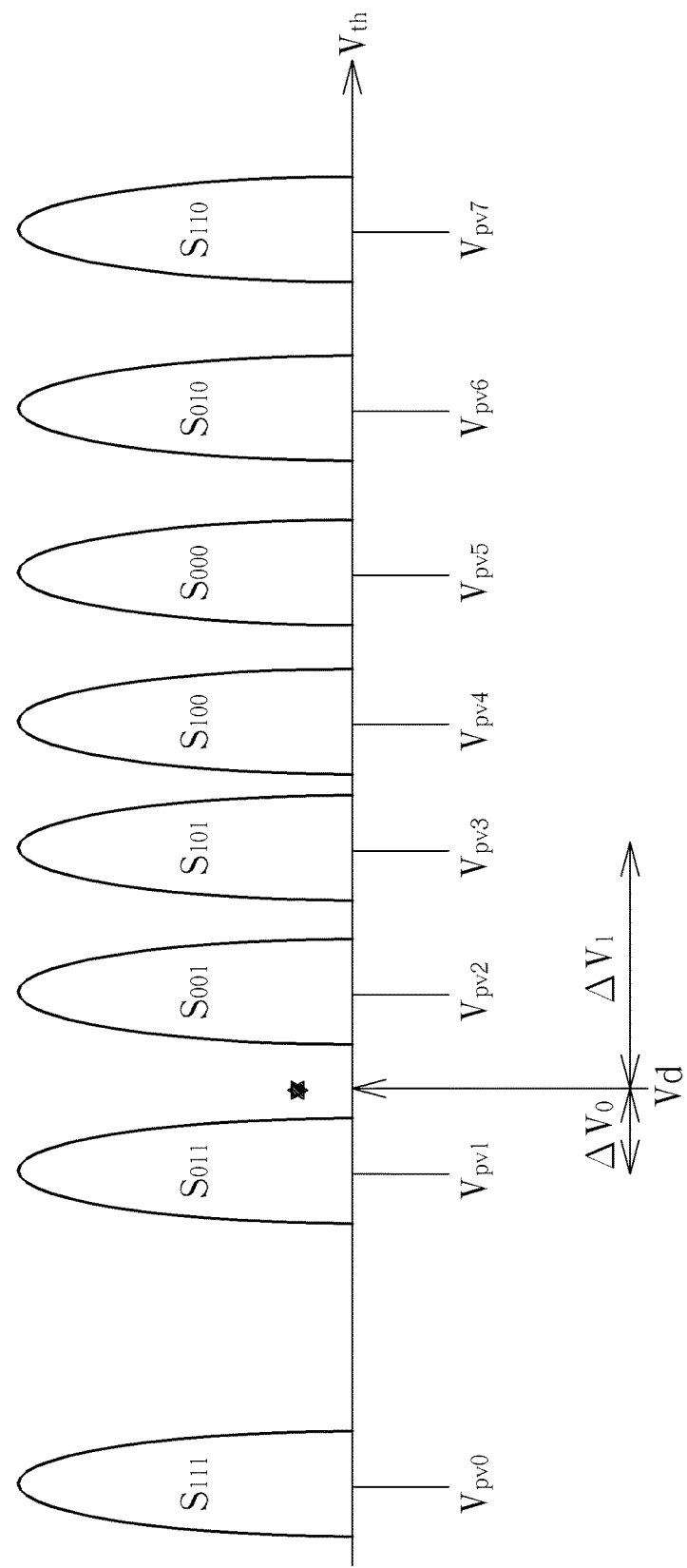
FIG. 5 illustrates the threshold voltage distribution of Flash cells of Triple Level Cell (TLC) Flash memories and corresponding states and associated parameters according to an embodiment of the present invention.

FIG. 5 illustrates the threshold voltage distribution of the Flash cells of TLC Flash memories and the corresponding states $\{S_{000}, S_{001}, S_{010}, S_{011}, S_{100}, S_{101}, S_{110}, S_{111}\}$ and the associated parameters according to an embodiment of the present invention, where the suffixes of these states $\{S_{000}, S_{001}, S_{010}, S_{011}, S_{100}, S_{101}, S_{110}, S_{111}\}$ are labeled with the programmed logic values {000, 001, 010, 011, 100, 101, 110, 111}. Typically, these states can be arranged in the order of the states $\{S_{111}, S_{011}, S_{001}, S_{101}, S_{100}, S_{000}, S_{010}, S_{110}\}$, such as the order disclosed in FIG. 5. This is for illustrative purposes only, and is not meant to be a limitation of the present invention. According to some variations of this embodiment, the states can be arranged in various kinds of order, rather than the order disclosed in FIG. 5.

In this embodiment, the aforementioned memory such as the Flash memory 120 can be an MLC Flash memory, and more particularly, a TLC Flash memory. With regard to a specific bit of the memory cell under consideration within the Flash memory 120, the memory device 100 (e.g. the aforementioned controller such as the memory controller 110, or the aforementioned memory such as the Flash memory 120) can determine a first voltage difference and a second voltage difference according to the two closest states in which the respective values of the specific bit are different from each other, where the first voltage difference represents the voltage difference between the determined voltage Vd and the threshold voltage of a first state of the two closest states, and the second voltage difference represents the voltage difference between the determined voltage Vd and the threshold voltage of a second state of the two closest states. As a result, the memory device 100 (e.g. the memory controller 110 or the Flash memory 120) can determine the soft information corresponding to the specific bit according to the first voltage difference and the second voltage difference.

More specifically, a Flash cell can store three bits of data. When the Flash cell is programmed with a logic value such as any of the logic values {111, 011, 001, 101, 100, 000, 010, 110}, the threshold voltage of the Flash cell can be in a corresponding state within the eight different states $\{S_{111}, S_{011}, S_{001}, S_{101}, S_{100}, S_{000}, S_{010}, S_{110}\}$ shown in FIG. 5. Theoretically, the horizontal location of the threshold voltage of the Flash cell will fall within a range between two intersection points shown in FIG. 5, and more particularly, the intersection points of the threshold voltage distribution curve of the corresponding state and the horizontal axis. As shown in FIG. 5, a Flash cell programmed with the logic value "111" will have the highest probability to have the threshold voltage of $V_{pv0}$, a Flash cell programmed with the logic value "011" will have the highest probability to have the threshold voltage of $V_{pv1}$, and a Flash cell programmed with the logic value "001" will have the highest probability to have the threshold voltage of $V_{pv2}$, and so on. In order to obtain the soft information of the memory cell under consideration, the voltage differences $\Delta V_0$ and $\Delta V_1$ should be determined. For example, it is currently required to obtain the soft information of the MSB of the memory cell, for use of performing soft decoding regarding the MSB of the memory cell, where the memory device 100 can determine the determined voltage Vd mentioned above. In a situation such as that shown in FIG. 5, the voltage difference $\Delta V_0$ can be determined to be the voltage difference between the determined voltage Vd and the threshold voltage $V_{pv1}$, where with regard to zero MSB states (i.e. the states to which the logic values having the MSB of 0 within the logic values {111, 011, 001, 101, 100, 000, 010, 110} correspond), the threshold voltage $V_{pv1}$ is located at the same horizontal location of the peak of the threshold voltage distribution curve of the state closest to the determined voltage Vd within the zero MSB states on the left of the star pattern. In addition, the voltage difference $\Delta V_1$ can be determined to be the voltage difference between the determined voltage Vd and the threshold voltage $V_{pv3}$, where with regard to non-zero MSB states (i.e. the states to which the logic values having the MSB of 1 within the logic values {111, 011, 001, 101, 100, 000, 010, 110} correspond), the threshold voltage $V_{pv3}$ is located at the same horizontal location of the peak of the threshold voltage distribution curve of the state closest to the determined voltage Vd within the non-zero MSB states on the right of the star pattern.

Please note that, when the voltage differences $\Delta V_0$ and $\Delta V_1$ are determined, two states to which the correct bit of the memory cell corresponds, and more particularly, the two closest states in which the respective values of the bit are different from each other, should be selected for determining the voltage differences $\Delta V_0$ and $\Delta V_1$. For example, according to this embodiment, the two states $S_{011}$ and $S_{101}$ respectively having the logic values "011" and "101" as their suffixes are the two closest states in which the respective values of the MSB are different from each other. Therefore, when soft decoding operations are performed with regard to the specific bit mentioned above, such as the MSB of the memory cell, the aforementioned two closest states $S_{011}$ and $S_{101}$ are good candidate states, and the corresponding threshold voltages $V_{pv1}$ and $V_{pv3}$ thereof can be utilized for determining the aforementioned voltage differences $\Delta V_0$ and $\Delta V_1$, respectively. In contrast to this, the two states $S_{011}$ and $S_{001}$ respectively having the logic values "011" and "001" as their suffixes are two states in which the respective values of the MSB are the same. Therefore, when soft decoding operations are performed with regard to the MSB of the memory cell, the two states $S_{011}$ and $S_{001}$ are not good candidate states.

Figure 6A:
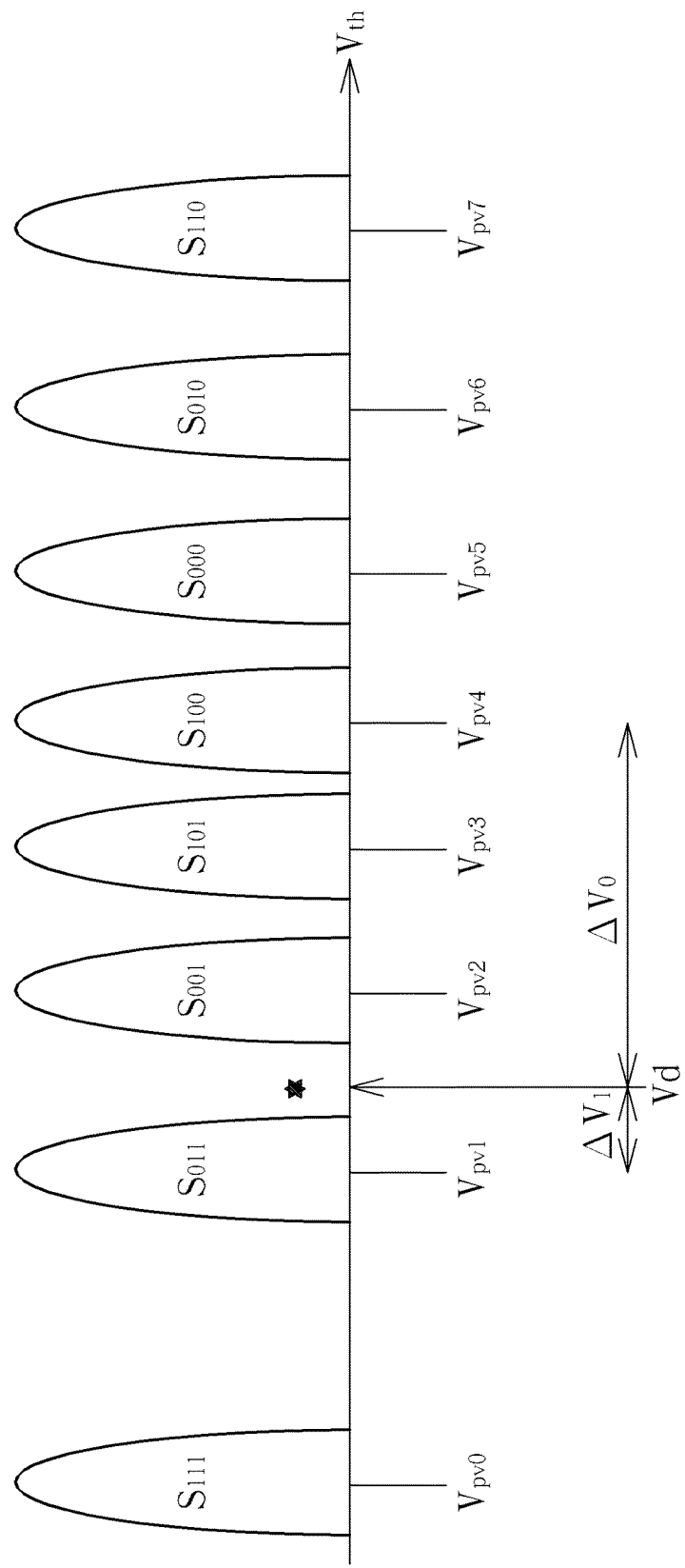
FIGS. 6A-6C illustrate the threshold voltage distribution of Flash cells of TLC Flash memories and corresponding states and associated parameters according to different embodiments of the present invention.

FIG. 6A illustrates the threshold voltage distribution of the Flash cells of TLC Flash memories and the corresponding states $\{S_{000}, S_{001}, S_{010}, S_{011}, S_{100}, S_{101}, S_{110}, S_{111}\}$ and the associated parameters according to another embodiment of the present invention. For example, the specific bit mentioned above may represent the least significant bit (LSB) of the memory cell, and it is currently required to obtain the soft information of the LSB of the memory cell, for use of performing soft decoding regarding the LSB of the memory cell, where the memory device 100 can determine the determined voltage Vd mentioned above. In a situation such as that shown in FIG. 6A, the voltage difference $\Delta V_0$ can be determined to be the voltage difference between the determined voltage Vd and the threshold voltage $V_{pv4}$, where with regard to zero LSB states (i.e. the states to which the logic values having the LSB of 0 within the logic values {111, 011, 001, 101, 100, 000, 010, 110} correspond), the threshold voltage $V_{pv4}$ is located at the same horizontal location of the peak of the threshold voltage distribution curve of the state closest to the determined voltage Vd within the zero LSB states on the right of the star pattern. In addition, the voltage difference $\Delta V_1$ can be determined to be the voltage difference between the determined voltage Vd and the threshold voltage $V_{pv1}$, where with regard to non-zero LSB states (i.e. the states to which the logic values having the LSB of 1 within the logic values {111, 011, 001, 101, 100, 000, 010, 110} correspond), the threshold voltage $V_{pv1}$ is located at the same horizontal location of the peak of the threshold voltage distribution curve of the state closest to the determined voltage Vd within the non-zero LSB states on the left of the star pattern.

Similarly, when the voltage differences $\Delta V_0$ and $\Delta V_1$ are determined, two states to which the correct bit of the memory cell corresponds, and more particularly, the two closest states in which the respective values of the bit are different from each other, should be selected for determining the voltage differences $\Delta V_0$ and $\Delta V_1$. For example, according to this embodiment, the two states $S_{011}$ and $S_{100}$ respectively having the logic values "011" and "100" as their suffixes are the two closest states in which the respective values of the LSB are different from each other. Therefore, when soft decoding operations are performed with regard to the LSB of the memory cell, the aforementioned two closest states $S_{011}$ and $S_{100}$ are good candidate states, and the corresponding threshold voltages $V_{pv1}$ and $V_{pv4}$ thereof can be utilized for determining the aforementioned voltage differences $\Delta V_1$ and $\Delta V_0$, respectively. In contrast to this, the two states $S_{011}$ and $S_{001}$ respectively having the logic values "011" and "001" as their suffixes are two states in which the respective values of the LSB are the same. Therefore, when soft decoding operations are performed with regard to the LSB of the memory cell, the two states $S_{011}$ and $S_{001}$ are not good candidate states.

Figure 6B:
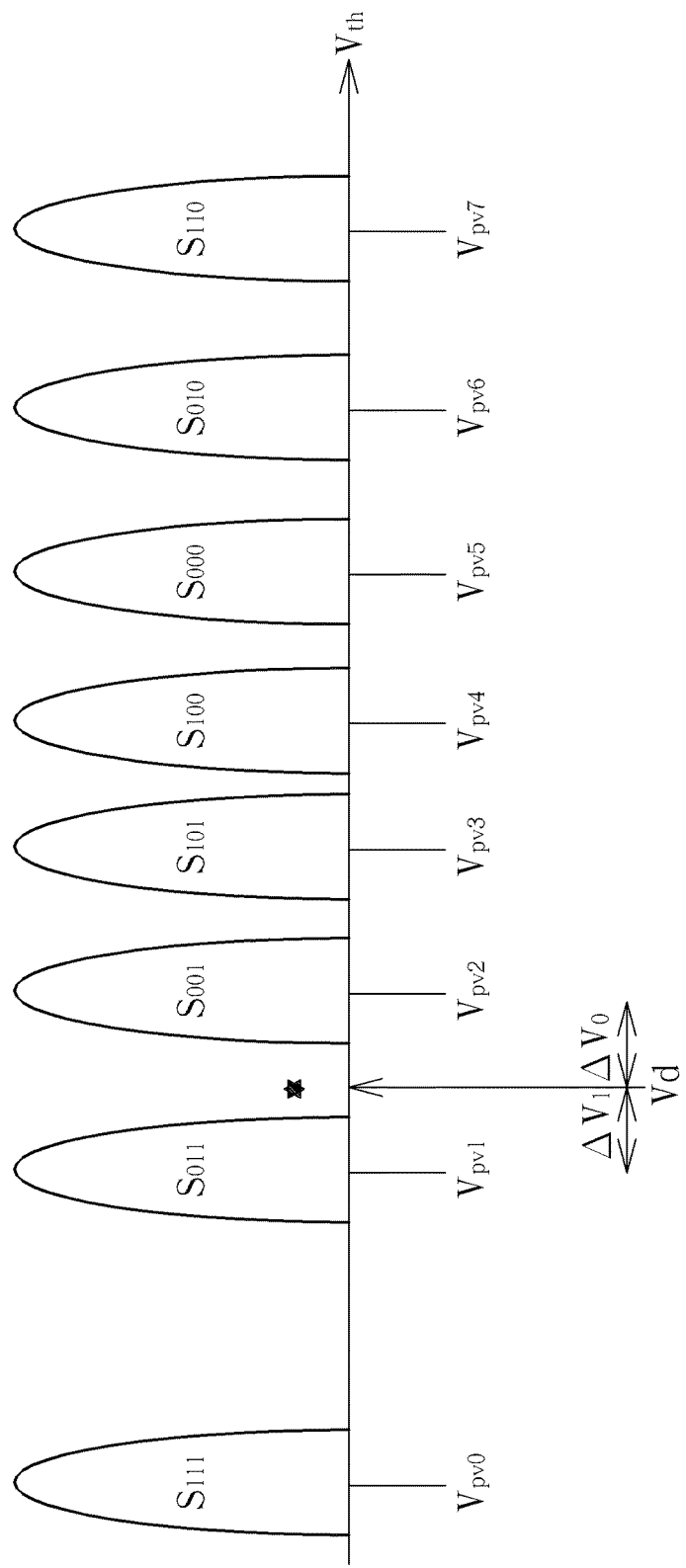

According to a variation of the embodiment shown in FIG. 6A, such as the embodiment shown in FIG. 6B, suppose that within the respective bits of the memory cell, the bit under consideration is a bit that is intermediate in bit significance, and more particularly, the central significant bit (CSB). According to the embodiment shown in FIG. 6B, the two states $S_{011}$ and $S_{001}$ respectively having the logic values "011" and "001" as their suffixes are the two closest states in which the respective values of the CSB are different from each other. Therefore, when soft decoding operations are performed with regard to the CSB of the memory cell, the aforementioned two closest states $S_{011}$ and $S_{001}$ are good candidate states, and the corresponding threshold voltages $V_{pv1}$ and $V_{pv2}$ thereof can be utilized for determining the aforementioned voltage differences $\Delta V_1$ and $\Delta V_0$, respectively.

Figure 6C:
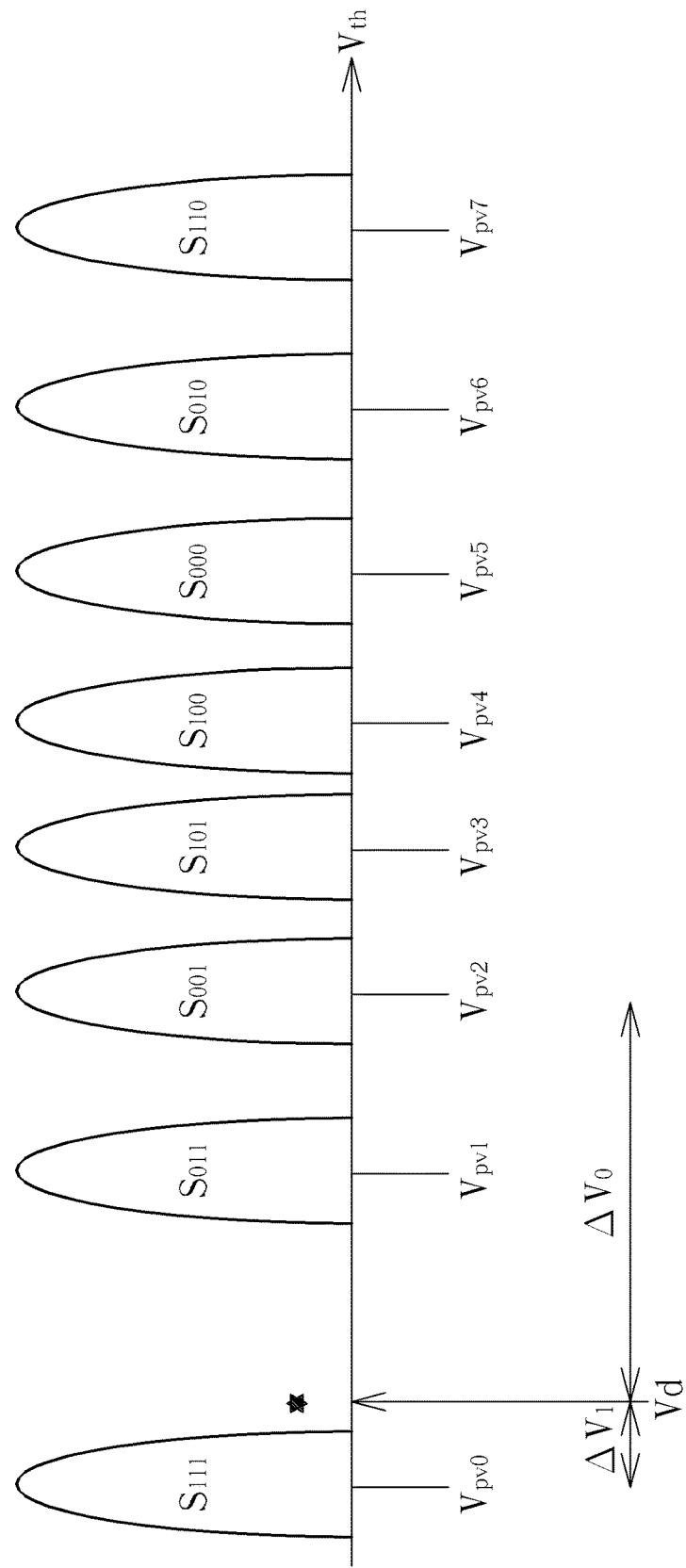

According to another variation of the embodiment shown in FIG. 6A, such as the embodiment shown in FIG. 6C, suppose that the horizontal location of the star pattern falls within a range between the threshold voltages $V_{pv0}$ and $V_{pv1}$, rather than falling within a range between the threshold voltages $V_{pv1}$ and $V_{pv2}$, where within the respective bits of the memory cell, the bit under consideration is still the CSB mentioned above. According to the embodiment shown in FIG. 6C, the two states $S_{111}$ and $S_{001}$ respectively having the logic values "111" and "001" as their suffixes are the two closest states in which the respective values of the CSB are different from each other. Therefore, when soft decoding operations are performed with regard to the CSB of the memory cell, the aforementioned two closest states $S_{111}$ and $S_{001}$ are good candidate states, and the corresponding threshold voltages $V_{pv0}$ and $V_{pv2}$ thereof can be utilized for determining the aforementioned voltage differences $\Delta V_1$ and $\Delta V_0$, respectively. In contrast to this, the two states $S_{111}$ and $S_{011}$ respectively having the logic values "111" and "011" as their suffixes are two states in which the respective values of the CSB are the same. Therefore, when soft decoding operations are performed with regard to the CSB of the memory cell, the two states $S_{111}$ and $S_{011}$ are not good candidate states.

VI. Obtaining Soft Information with Code Word

The burden of calculating the soft information can be shared by the memory controller 110. According to an embodiment of the present invention, in order to obtain the determined voltage Vd, the memory controller 110 and the Flash memory 120 may own a protocol, for performing communication between the memory controller 110 and the Flash memory 120. Please refer to FIG. 3 as well. Both of the memory controller 110 and the Flash memory 120 know (or are arranged to operate according to the rule) that the $1^{st}$ sensing operation will start with the first sensing voltage $V_{1st}$. If the exact threshold voltage Ve is less than the first sensing voltage $V_{1st}$ (i.e. it is detected that a current flows through the under estimation memory cell), the Flash memory 120 replies the memory controller 110 with the digital value "1" and then performs the $2^{nd}$ sensing operation with the second sensing voltage $V_{2nd}$. The memory controller 110 receives the digital value "1" replied by the Flash memory 120 and therefore realizes (or is notified of the fact) that the exact threshold voltage Ve is less than the first sensing voltage $V_{1st}$, and the next sensing voltage will be the second sensing voltage $V_{2nd}$. Next, if the exact threshold voltage Ve is greater than the second sensing voltage $V_{2nd}$ (i.e. it is detected that no current flows through the under estimation memory cell), the Flash memory 120 replies the memory controller 110 with the digital value "0" and then performs the 3rd sensing operation with the third sensing voltage $V_{3rd}$. The memory controller 110 receives the digital value "0" replied by the Flash memory 120 and therefore realizes (or is notified of the fact) that the exact threshold voltage Ve is greater than the second sensing voltage $V_{2nd}$, and the next sensing voltage will be the third sensing voltage $V_{3rd}$. Afterward, if the exact threshold voltage Ve is less than the third sensing voltage $V_{3rd}$ (i.e. it is detected that a current flows through the under estimation memory cell), the Flash memory 120 replies the memory controller 110 with the digital value "1". The memory controller 110 receives the digital value "1" replied by the Flash memory 120 and therefore realizes (or is notified of the fact) that the exact threshold voltage Ve is less than the third sensing voltage $V_{3rd}$.

Based on the above disclosed code word sent by the Flash memory 120, such as the digital value "1" or the digital value "0", the memory controller 110 realizes (or determines) that the exact threshold voltage Ve is located between the second sensing voltage $V_{2nd}$ and the third sensing voltage $V_{3rd}$. According to an implementation choice of this embodiment, the memory controller 110 can calculate the determined voltage Vd, and more particularly, determine the determined voltage Vd to be $((V_{2nd}+V_{3rd})/2)$. According to another implementation choice of this embodiment, the memory controller 110 can control the Flash memory 120 to perform more sensing operations, for achieving a higher resolution. In addition, after obtaining the determined voltage Vd, the memory controller 110 can calculate the soft information SI accordingly, and more particularly, calculate the soft information SI according to the determined voltage Vd. For example, when calculating the soft information SI with regard to each reply, such as the aforementioned code word sent by the Flash memory 120, the memory controller 110 can utilize Equation (1) and/or predetermined weighting value(s).

VII. Obtaining Soft Information with Read Retry Mechanism

Figure 7:
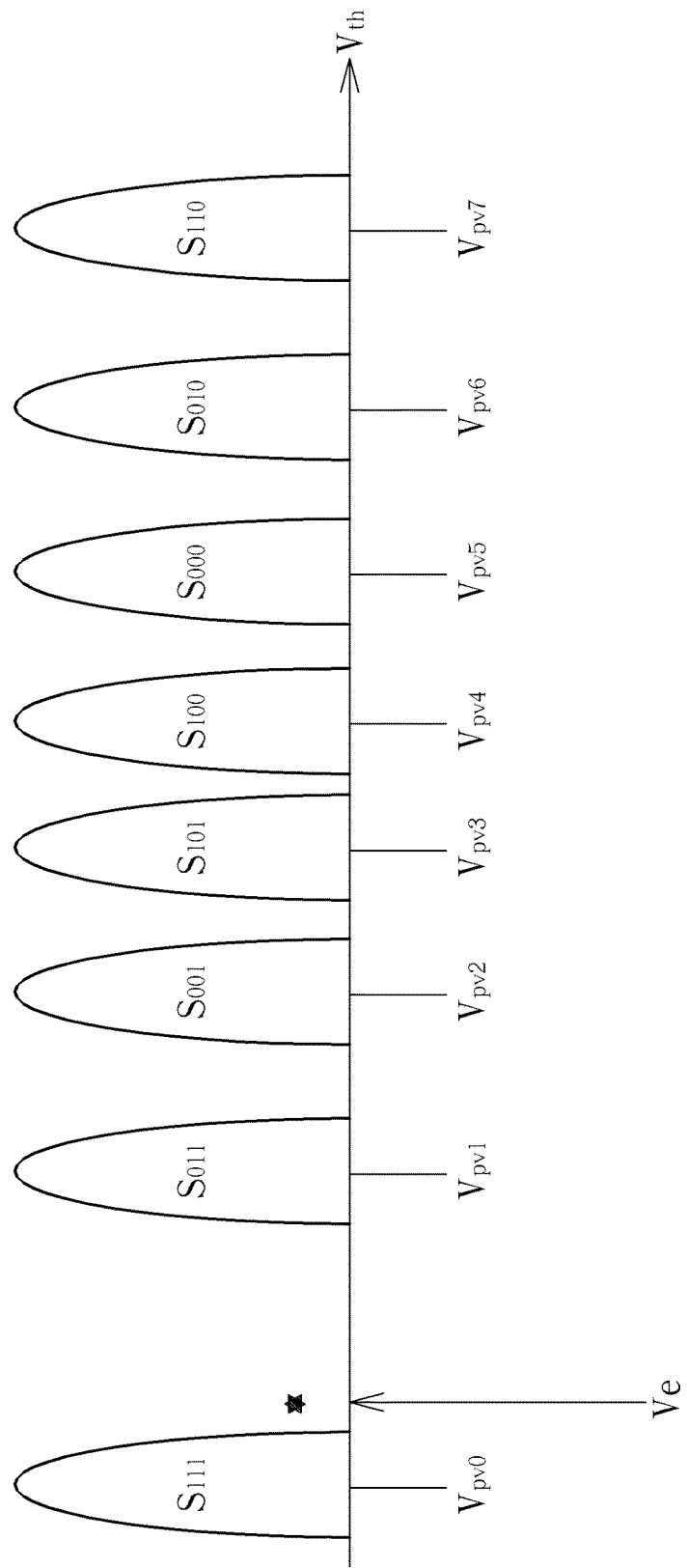
FIG. 7 illustrates the threshold voltage distribution of Flash cells of TLC Flash memories and corresponding states and associated parameters according to another embodiment of the present invention.

According to some embodiments of the present invention, in order to obtain soft information from the Flash memory 120 in a situation where the above disclosed determination of the determined voltage Vd and the above disclosed calculations of the soft information are not supported, some auxiliary operations are provided to make the memory controller 110 be capable of utilizing the originative read retry mechanism in the Flash memory 120 as a tool for obtaining the soft information. Referring to FIG. 7, the aforementioned auxiliary operations are described as follows.

Assume that the exact threshold voltage Ve of the memory cell under consideration is located at the horizontal location of the star pattern shown in FIG. 7. The memory controller 110 controls the Flash memory 120 to change the sensing voltage for determining the MSB of the memory cell step by step. The Flash memory 120 determines the MSB of the memory cell by utilizing a first sensing voltage Vc that is located at the center of the threshold voltages $V_{pv0}$ and $V_{pv1}$ along the horizontal axis (i.e. the average of the threshold voltages $V_{pv0}$ and $V_{pv1}$). For example, the Flash memory 120 replies the memory controller 110 with the digital value "0", in order to indicate that the sensing voltage Vc is greater than the exact threshold voltage Ve, which means a current flows through the under estimation memory cell in this situation. Next, the memory controller 110 controls the Flash memory 120 to determine the exact threshold voltage Ve by utilizing a second sensing voltage (Vc−ΔV), where ΔV can be 50 mV or any other predetermined value. As a result, the Flash memory 120 replies the memory controller 110 with the result of the sensing operation. If the result is still the same digital value "0", the memory controller 110 can control the Flash memory 120 to determine the exact threshold voltage Ve by further utilizing any predetermined value such as a third sensing voltage (Vc−2*(ΔV)). The rest may be deduced by analogy. For example, in a situation where the result of the (n−1)$^{th}$ sensing operation is still the digital value "0", when performing the n$^{th}$ sensing operation, the memory controller 110 can control the Flash memory 120 to determine the exact threshold voltage Ve by further utilizing an n$^{th}$ sensing voltage (Vc−(n−1)*(ΔV)). Thus, again and again, the memory controller 110 keeps reducing the sensing voltage until the result of the sensing operation of a certain time changes from the digital value "0" to the digital value "1". More particularly, when the result of the (N")$^{th}$ sensing operation changes from the digital value "0" to the digital value "1", the memory controller 110 realizes (or determines) that the exact threshold voltage Ve is located between the (N")$^{th}$ sensing voltage (Vc−(N"−1)*(ΔV)) and the (N"−1)$^{th}$ sensing voltage (Vc−(N"−2)*(ΔV)). Thus, the memory controller 110 can determine the aforementioned determined voltage Vd according to the latest two sensing voltages (i.e. the sensing voltages of the last two sensing operations), and further determine the aforementioned soft information accordingly, and more particularly, determine the soft information according to the determined voltage Vd. For example, the memory controller 110 can determine the determined voltage Vd to be the average of the sensing voltages respectively utilized in the last two sensing operations, and more particularly, determine the determined voltage Vd according to the following equation:

$$Vd=(Vc-(N''-1.5)*(\Delta V));$$

where the notation N" represents one plus the total number of times of successive sensing operations whose detection result is the digital value "0".

Please note that, when the read retry mechanism is utilized for finding the determined voltage Vd, the correct bit of the memory cell should be selected. For example, according to this embodiment, with regard to the two states $S_{111}$ and $S_{011}$ respectively having the logic values "111" and "011" as their suffixes are the two closest states in which the respective values of the MSB are different from each other. Therefore, when soft decoding operations are performed with regard to the MSB of the memory cell, the aforementioned two closest states $S_{111}$ and $S_{011}$ are good candidate states, and the corresponding threshold voltages $V_{pv0}$ and $V_{pv1}$ thereof can be utilized for determining the aforementioned first sensing voltage Vc, where the memory controller 110 can determine the first sensing voltage Vc to be the average of the threshold voltages $V_{pv0}$ and $V_{pv1}$ (or a weighted average of the threshold voltages $V_{pv0}$ and $V_{pv1}$).

According to a variation of this embodiment (still referring to FIG. 7), suppose that the horizontal location of the star pattern shown in FIG. 7 moves to the right of the center of the threshold voltages $V_{pv0}$ and $V_{pv1}$ along the horizontal axis (i.e. the average of the threshold voltages $V_{pv0}$ and $V_{pv1}$), which means the exact threshold voltage Ve of the memory cell is located between the center mentioned above (i.e. the average of the threshold voltages $V_{pv0}$ and $V_{pv1}$) and the threshold voltage $V_{pv1}$. The memory controller 110 can determine the determined voltage Vd to be the average of the sensing voltages respectively utilized in the last two sensing operations, and more particularly, determine the determined voltage Vd according to the following equation:

$$Vd=(Vc+(N''-1.5)*(\Delta V));$$

where the notation N" of this variation represents one plus the total number of times of successive sensing operations whose detection result is the digital value "1".

According to another variation of this embodiment (still referring to FIG. 7), with regard to the two states $S_{111}$ and $S_{011}$ respectively having the logic values "111" and "011" as their suffixes are two states in which the respective values of the LSB are the same. Therefore, when soft decoding operations are performed with regard to the LSB of the memory cell, the two states $S_{111}$ and $S_{011}$ are not good candidate states, and the corresponding threshold voltages $V_{pv0}$ and $V_{pv1}$ thereof are not suitable for determining the aforementioned first sensing voltage Vc, where the memory controller 110 should not determine the first sensing voltage Vc to be the average of the threshold voltages $V_{pv0}$ and $V_{pv1}$ (or a weighted average of the threshold voltages $V_{pv0}$ and $V_{pv1}$). More particularly, in this variation, the threshold voltages $V_{pv0}$ and $V_{pv4}$ are those suitable for determining the aforementioned first sensing voltage Vc since the states $S_{111}$ and $S_{100}$ respectively represented by the threshold voltages $V_{pv0}$ and $V_{pv4}$ are the two closest states in which the respective values of the LSB are different from each other, where the memory controller 110 can determine the first sensing voltage Vc to be the average of the threshold voltages $V_{pv0}$ and $V_{pv4}$ (or a weighted average of the threshold voltages $V_{pv0}$ and $V_{pv4}$).

According to another variation of this embodiment (still referring to FIG. 7), with regard to the two states $S_{111}$ and $S_{011}$ respectively having the logic values "111" and "011" as their suffixes are two states in which the respective values of the CSB are the same. Therefore, when soft decoding operations are performed with regard to the CSB of the memory cell, the two states $S_{111}$ and $S_{011}$ are not good candidate states, and the corresponding threshold voltages $V_{pv0}$ and $V_{pv1}$ thereof are not suitable for determining the aforementioned first sensing voltage Vc, where the memory controller 110 should not determine the first sensing voltage Vc to be the average of the threshold voltages $V_{pv0}$ and $V_{pv1}$ (or a weighted average of the threshold voltages $V_{pv0}$ and $V_{pv1}$). More particularly, in this variation, the threshold voltages $V_{pv0}$ and $V_{pv2}$ are those suitable for determining the aforementioned first sensing voltage Vc since the states $S_{111}$ and $S_{001}$ respectively represented by the threshold voltages $V_{pv0}$ and $V_{pv2}$ are the two closest states in which the respective values of the CSB are different from each other, where the memory controller 110 can determine the first sensing voltage Vc to be the average of the threshold voltages $V_{pv0}$ and $V_{pv2}$ (or a weighted average of the threshold voltages $V_{pv0}$ and $V_{pv2}$).

It is an advantage of the present invention that, by properly generating soft information, with associated soft/hard information transmission control (e.g. the soft/hard information transmission control disclosed in the method shown in FIG. 4) being provided, the present invention can properly perform memory access management regarding the data accessed by the controller, in order to reduce the probability of error occurrence. In addition, implementing according to the respective embodiments/variations will not cause a lot of additional costs, and even can save costs in contrast to the related art. Therefore, based upon the contents disclosed above, the related art problem is no longer an issue, and the overall cost will not excessively increase.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A memory access module for performing memory access management of a storage device comprising a plurality of storage cells, the memory access module comprising:

sensing means for performing a plurality of sensing operations respectively corresponding to a plurality of different sensing voltages in order to generate at least a first digital value of a storage cell, wherein each subsequent sensing operation corresponds to a sensing voltage which is determined according to a result of the previous sensing operation;

processing means for using the first digital value to obtain soft information of a bit stored in the storage cell; and decoding means for using the soft information to perform soft decoding.

2. The memory access module of claim 1, wherein the plurality of sensing operations further generates a second digital value of a storage cell, and the second digital value is also used to obtain the soft information of a bit stored in the storage cell.

3. The memory access module of claim 2, wherein the first digital value and the second digital value are used to determine information of a same bit stored in the storage cell.

4. The memory access module of claim 1, wherein each storage cell has a number of possible bit(s) which directly corresponds to a number of possible states of the storage cell.

5. The memory access module of claim 1, wherein when a result of a first sensing operation is that current flows through the storage cell, a subsequent sensing operation will correspond to a sensing voltage which is less than a sensing voltage corresponding to the first sensing operation, and when a result of a first sensing operation is that current does not flow through the storage cell, a subsequent sensing operation will correspond to a sensing voltage which is higher than a sensing voltage corresponding to the first sensing operation.

6. The memory access module of claim 2, wherein the second digital value comprises a plurality of second digital values, and each of the second digital values is generated according to another of the second digital values.

7. The memory access module of claim 2, wherein the second digital value represents a candidate threshold voltage of the storage cell and the soft information corresponds to a threshold voltage of the storage cell.

8. The memory access module of claim 7, further comprising:

determining means for determining the threshold voltage of the storage cell according to the candidate threshold voltage.

9. The memory access module of claim 8, wherein the determining means can determine the threshold voltage of the storage cell according to the second digital value and the candidate threshold voltage.

10. The memory access module of claim 1, further comprising controlling means for accessing the storage device, wherein the controlling means comprises:

storage means for storing a program code; and processing means for executing a program code to control access to the storage device and manage the plurality of storage cells.

* * * * *